United States Patent
Rogers

(10) Patent No.: US 6,700,450 B2
(45) Date of Patent: Mar. 2, 2004

(54) VOLTAGE-CONTROLLED OSCILLATOR WITH AN AUTOMATIC AMPLITUDE CONTROL CIRCUIT

(75) Inventor: John W. M. Rogers, Ottawa (CA)

(73) Assignee: Cognio, Inc., Gaithersburg, MD (US)

( * ) Notice: Subject to any disclaimer, the term of this patent is extended or adjusted under 35 U.S.C. 154(b) by 0 days.

(21) Appl. No.: 10/065,719

(22) Filed: Nov. 13, 2002

(65) Prior Publication Data

US 2004/0017268 A1 Jan. 29, 2004

Related U.S. Application Data

(60) Provisional application No. 60/319,430, filed on Jul. 29, 2002.

(51) Int. Cl.[7] .............................................. H03B 5/08
(52) U.S. Cl. .................................. 331/117 R; 331/167
(58) Field of Search ............................ 331/167, 117 R, 331/115, 108 R

(56) References Cited

U.S. PATENT DOCUMENTS

| | | | |
|---|---|---|---|
| 3,838,564 A | * 10/1974 | Holcomb | 368/157 |
| 5,418,497 A | * 5/1995 | Martin | 331/48 |
| 5,834,983 A | 11/1998 | Higgins, Jr. | 331/109 |
| 5,856,763 A | * 1/1999 | Reeser et al. | 331/49 |
| 6,060,956 A | * 5/2000 | Mole et al. | 331/117 R |
| 6,268,777 B1 | 7/2001 | Welch | 331/117 FE |

OTHER PUBLICATIONS

Rogers et al., "A 2.4 GHz Wide Tuning Range VCO with Automatic Level Control Circuitry," Proc. ESSCIRC 2001, Villach, Austria, Sep. 2001, pp. 356–359.

* cited by examiner

*Primary Examiner*—Robert Pascal
*Assistant Examiner*—J C
(74) *Attorney, Agent, or Firm*—D. Andrew Floam

(57) ABSTRACT

A VCO having an automatic amplitude control circuit In the form of a sensing amplifier provided in the feedback loop to sense the oscillator amplitude and draw current away only when the positive peak voltage Is above a certain value. In general, any amplifier may be used in the feedback loop that outputs current proportional to a peak positive input (in a non-linear and asymmetric fashion with respect to the changing voltage). In one example, the amplifier in the feedback loop comprises first and second transistors that are set nominally in cut off and behave as class C amplifiers. The advantage of this amplifier transistor configuration is that the amplifier they form has a low load on the LC tank circuit and a high input impedance.

11 Claims, 5 Drawing Sheets

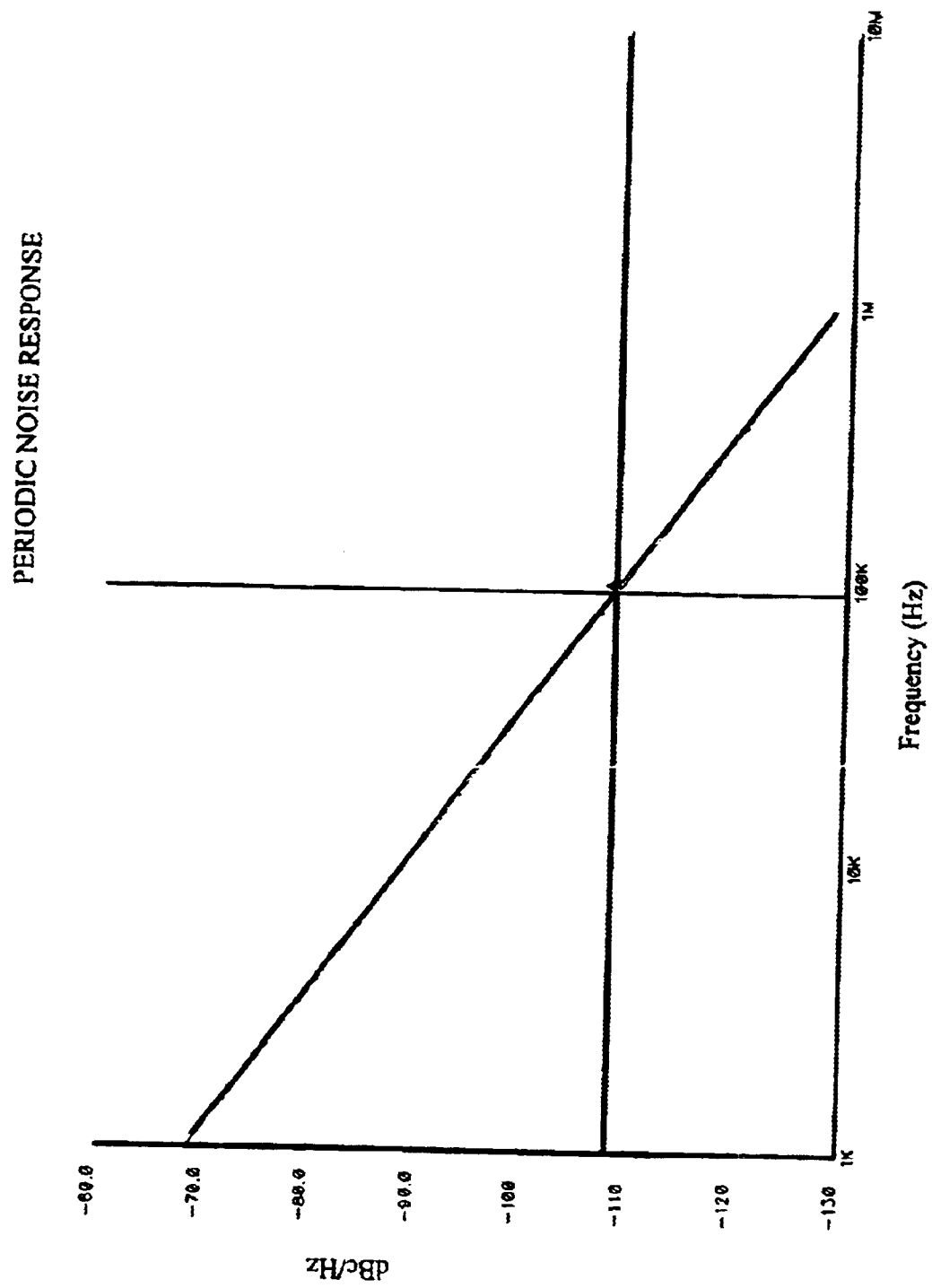
FIG. 5　PERIODIC NOISE RESPONSE

VOLTAGE-CONTROLLED OSCILLATOR WITH AN AUTOMATIC AMPLITUDE CONTROL CIRCUIT

BACKGROUND OF INVENTION

This application claims priority to U.S. Provisional Application No. 60/319,430, filed Jul. 29, 2002, the entirety of which is incorporated herein by reference.

The present invention relates to an automatic amplitude control loop that sets the current flowing through a voltage controlled oscillator (VCO) at an optimal level over process and temperature variations.

VCOs are used in radio communication devices to generate a desired signal frequency for up-mixing signals in the transmission process or down-mixing signals In the reception process. Implementing a VCO in an Integrated circuit (IC) is an important challenge in the design of a transceiver IC. One performance characteristic of a VCO is variation in the amplitude of the oscillator voltage. As a result, VCO design work includes various circuits, called automatic amplitude control circuits, to control the oscillator voltage amplitude. The VCO automatic amplitude control circuit should operate without degrading performance of other elements in the VCO. While amplitude control circuits are known in the art, many of these circuits negatively affect operation of the VCO.

What is needed is an VCO automatic amplitude control circuit that is easy to implement and does not impact performance of the VCO.

SUMMARY OF INVENTION

Briefly, a VCO is provided having an automatic amplitude control circuit in the form of a sensing amplifier provided in the feedback loop to sense the oscillator amplitude and draw current away only when the positive peak voltage is above a certain value. In general, any amplifier may be used in the feedback loop that outputs current proportional to a peak positive input (in a non-linear and asymmetric fashion with respect to the changing voltage). In one example, the amplifier in the feedback loop comprises first and second transistors that are set nominally in cut off and behave as class C amplifiers. The advantage of this amplifier transistor configuration is that the amplifier they form does not load the LC tank circuit and has a high input impedance.

The above and other objects and advantages will become more readily apparent when reference is made to the following description taken in conjunction with the accompanying drawings.

BRIEF DESCRIPTION OF DRAWINGS

FIG. 5 is a plot showing simulation of the phase noise versus frequency in the VCO.

DETAILED DESCRIPTION

Figure 1:
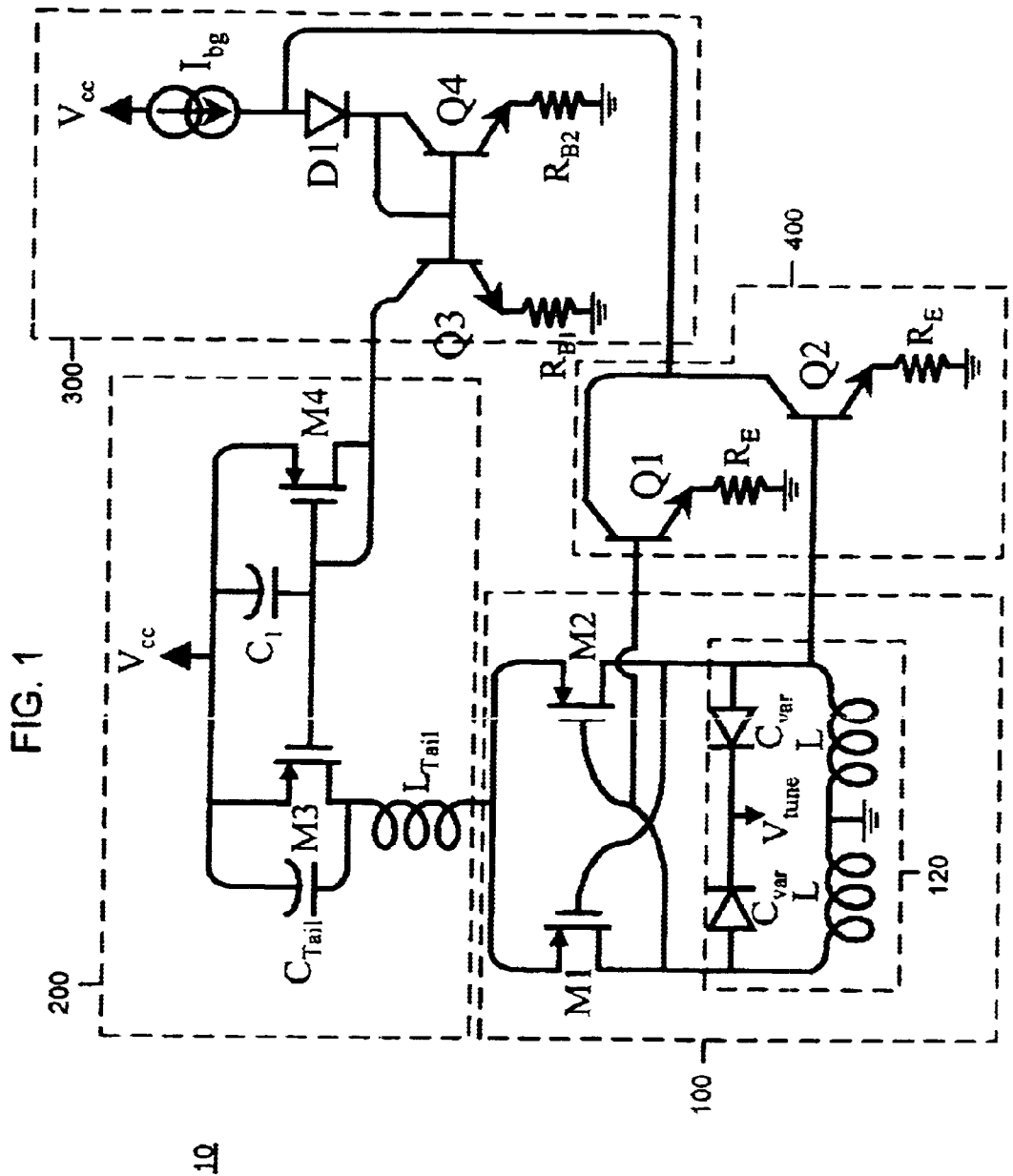
FIG. 1 is a schematic diagram of a voltage controlled oscillator (DCO) with an automatic amplitude control loop.

Referring first to FIG. 1, a voltage controlled oscillator (VCO) suitable for integrated circuit applications is shown at reference numeral 10. The VCO 10 comprises an oscillator circuit 100, a current source circuit 200, a bias circuit 300 and an amplifier 400. The current source circuit 200 is coupled to the oscillator circuit 100 to supply a current used by the oscillator circuit 100. The bias circuit 300 is connected to the current source circuit 200 to bias the current source circuit 200. The amplifier 400 is connected in a feedback loop between the bias circuit 300 and the oscillator circuit 100.

The oscillator circuit 100 comprises first and second PMOS transistors M1 and M2, respectively, connected in a negative resistance configuration across an LC tank 120. The LC tank comprises first and second inductors L and first and second PN-junction varactors $C_{var}$.

Figure 2:
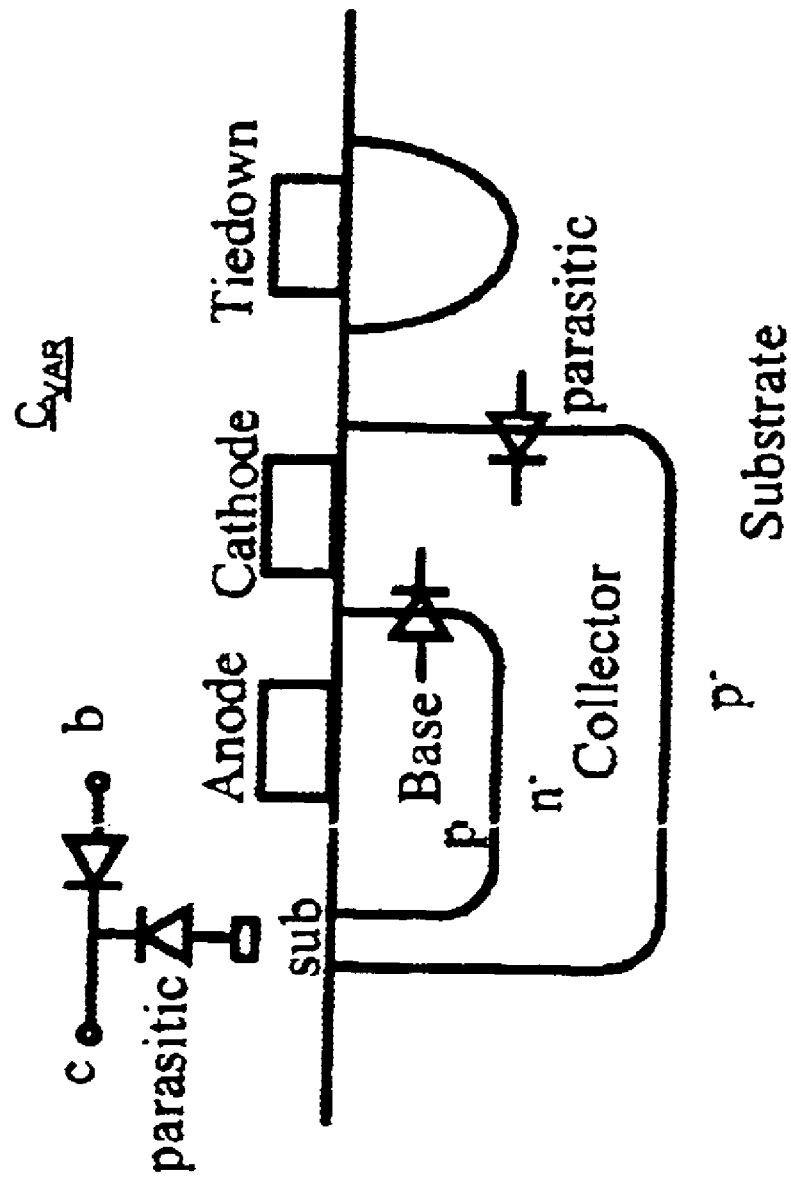
FIG. 2 is a schematic diagram showing physical construction of the PN junction varactor diode used in the VCO of FIG. 1.

The PN Junction varactors $C_{var}$ are advantageous because of their high Q at the frequencies of interest (for example, in one application, the SGHz ISM band). However, they have a parasitic substrate diode associated with the P side of the junction that has a very low Q as shown in FIG. 2. The N side of the diode is connected to AC ground to prevent the structure from having a very lossy substrate diode rendering it useless for VCO design. This is one advantage of the PMOS oscillator circuit 200 of FIG. 1. In this case, the LC tank 120 can be connected to ground rather than DC so that the diodes can be connected in the proper polarity without the need for any additional biasing.

The tank inductors L are made as large as possible to maximize the tank equivalent parallel resistance while still allowing the varactors $C_{var}$ to be large enough so that parasitic capacitance does not reduce the available frequency tuning range to an unacceptable level. The PMOS transistors M1 and M2 themselves are sized so that they have a DC $V_{GS}$ voltage of approximately two volts. This leaves one volt of headroom to accommodate the current source transistor 210. The inductor $L_{Tail}$ and the capacitor $C_{Tail}$ form a filter that is designed to filter out noise from the bias circuit 300 so that it does not affect the phase noise of the VCO 10.

The current source circuit 200 comprises first and second PMOS transistors M3 and M4 coupled to transistors M1 and M2 in the oscillator circuit 100 via inductor $L_{Tail}$ and capacitor $C_{Tail}$. Capacitor $C_1$ is included to form a dominant and controllable pole in the feedback loop so that stability of the feedback loop is assured for all operating conditions.

The bias circuit 300 comprises first and second transistors Q3 and Q4 and their associated base transistors $R_{B1}$ and $R_{B2}$ diode D1 and current source $I_{bg}$. The diode D1 provides a level shift so that the transistors Q1 and Q2 in the amplifier 400. to be described hereinafter, are not In saturation. Resistors $R_{B1}$ and $R_{B2}$ are included to degenerate the current mirror formed by transistors Q3 and Q4 and act to reduce the noise It generates. The current source $I_{bg}$ is a reference current generated by a band-gap circuit on the chip (not shown).

The amplifier 400 in the feedback loop comprises first and second transistors Q1 and Q2 coupled between the bias circuit 300 and the oscillator circuit 100. The transistors Q1 and Q2 are set nominally in cut off and behave as class C amplifiers. There are emitter resistors $R_E$ in the emitters of the transistors Q1 and Q2. The values of the emitter resistors $R_E$ set the amplitude control behavior of the amplifier 400 as described hereinafter. The base of transistor Q1 is coupled to the gate of transistor M2 and the base of transistor Q2 is coupled to a node between a varactor and an inductor in the LC tank circuit 120. By these connections, the amplifier 400 can sense the amplitude of the voltage of the oscillator circuit 100. The transistors Q1 and Q2 are connected in such a manner so that they do not load the tank and provide additional loss when they turn on, impacting phase noise. This is an important advantage over previous designs that load the tank with the dynamic emitter resistance of the limiting transistors. Thus, in this design, the transistors Q1 and Q2 do not act as clamping diodes.

Generally, it is difficult to set the current in the VCO 10 to an optimal level with any accuracy. The current required by the VCO 10 to achieve a given output level will change over the frequency tuning range (with changes in varactor $C_{var}$ and inductor L) over temperature and process. The feedback mechanism, an example of which is described above, sets the current in a very accurate manner.

In operation, the transistors Q1 and Q2 in the amplifier 400 have no effect on the oscillator circuit until the oscillator voltage amplitude reaches a desired level (set by values for the emitter resistors $R_E$) corresponding to the positive peak of the oscillation voltage. Once this level is reached, transistors Q) and Q2 turn on briefly and steal/draw current away from transistor Q4 in the bias circuit 300. This in turn reduces the current flowing into the oscillator circuit 100 until it is just enough to provide that level of output swing. The advantage of the amplifier transistor configuration shown in FIG. 1 is that the amplifier they form does not load the LC tank circuit 120 and has a high input impedance. Any amplifier may be used in the feedback loop that outputs current proportional to a peak positive input (in a non-linear and asymmetric fashion with respect to the changing voltage).

The current through the VCO 10 is set large enough to maximize the voltage swing at the tank to minimize the phase noise of the circuit. The swing is maximized when the transistors M1 and M2 are made to alternate between saturation and cutoff at the top and bottom of the VCO voltage swing. Once the transistors M1 and M2 reach this voltage swing level, raising the current will not cause the swing to grow any more, will worsen the phase noise performance, and will waste current.

Figure 3:
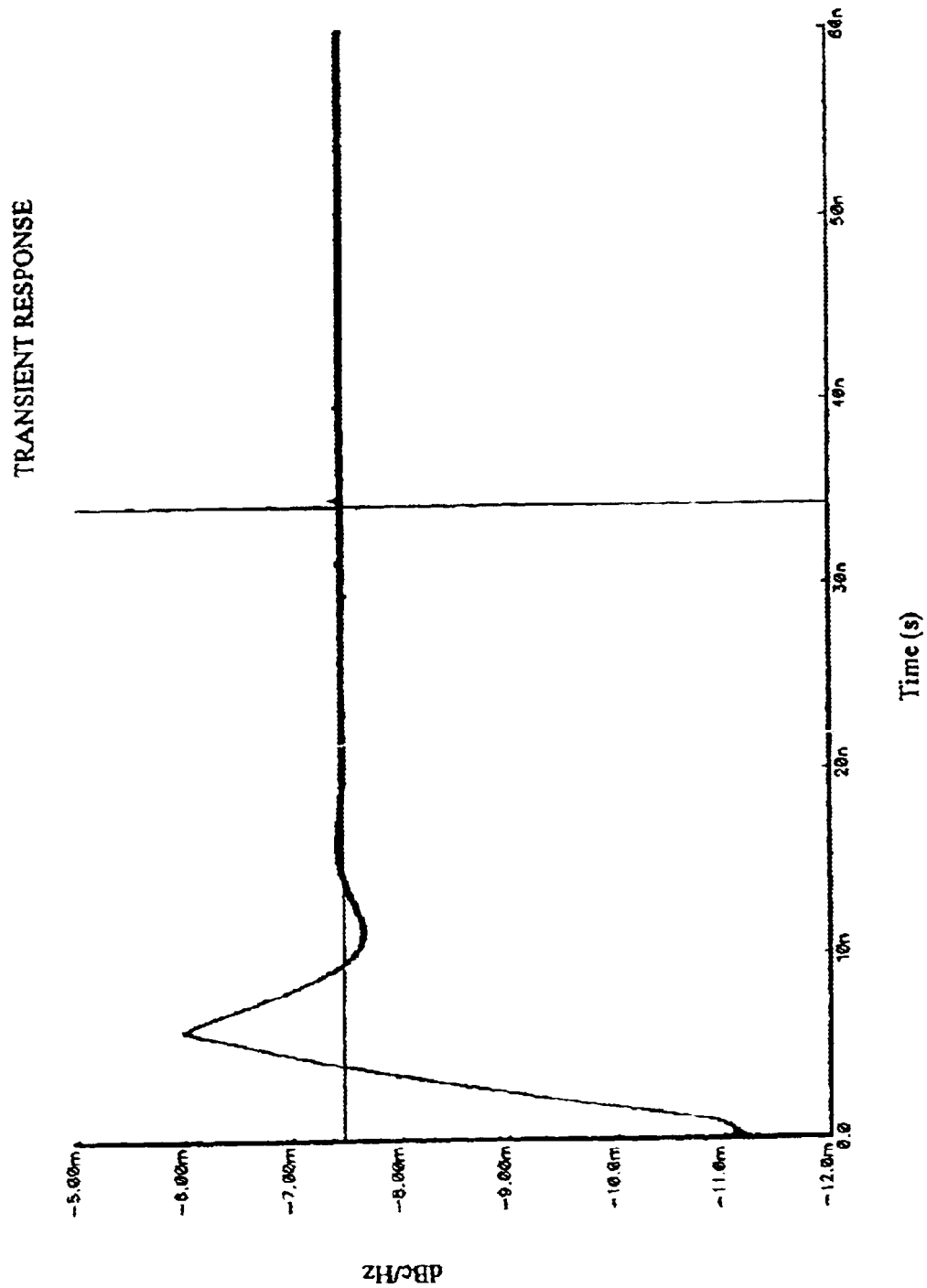
FIG. 3 is a plot showing a simulation of the transient current settling in the VCO.
Figure 4:
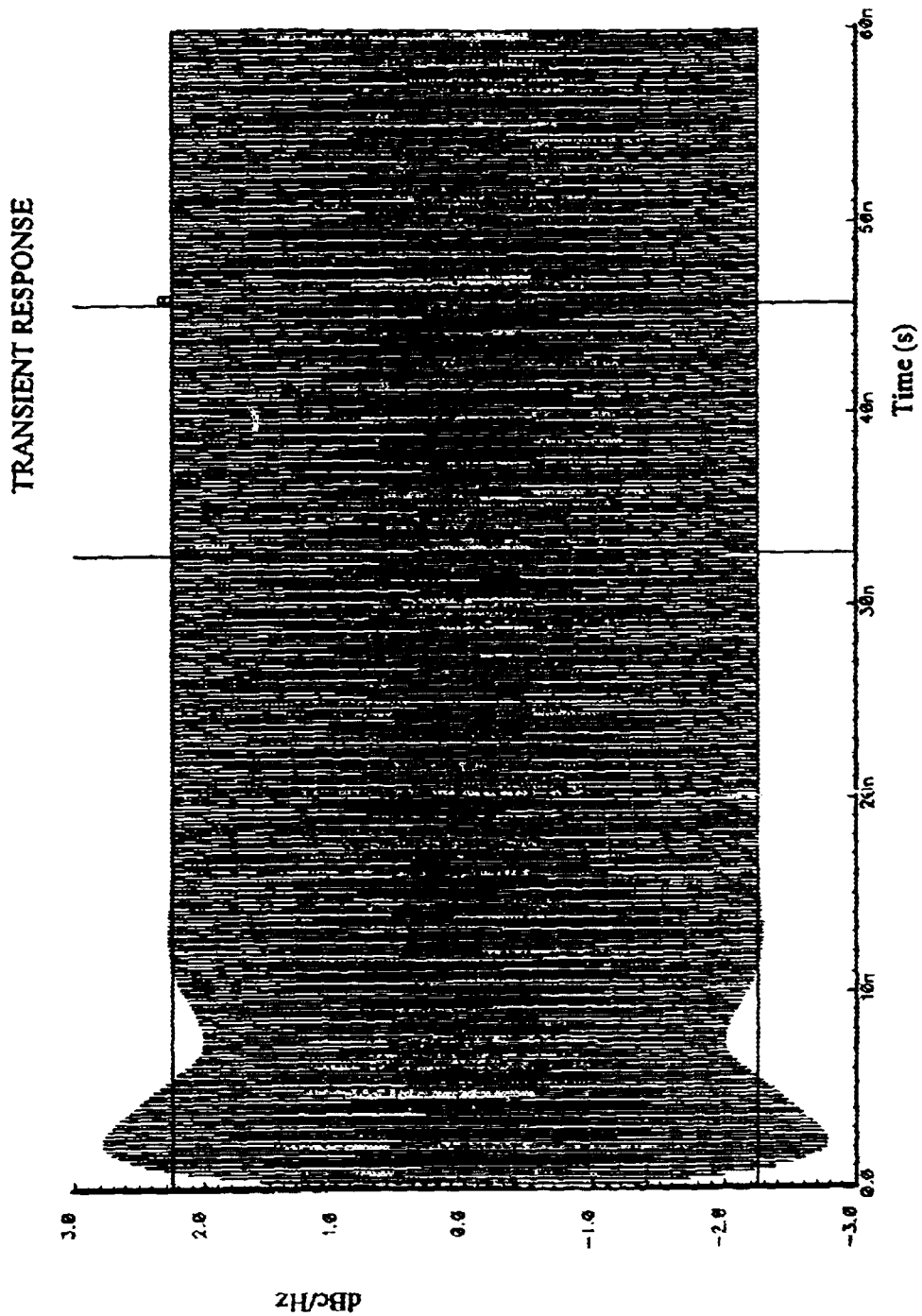
FIG. 4 is a plot showing a simulation of the transient voltage of the tank circuit settling in the VCO.

FIG. 3 shows simulation results for a VCO using the design of FIG. 1, where current through the oscillator (in transistor M3) settles to its final value of about 7.5 mA after an initial transient. The final current of the oscillator circuit 100 in this simulation example runs between 7.5 mA and 8.8 mA depending on the bias on the varactors, which runs between 0.3V and 2.45V (about 300 mV from the supply rail). The voltage in the LC tank settles to a constant 4.5 Vpp independent of frequency as shown in FIG. 4. The phase noise for this design has also been simulated and found to vary by no more than a few tenths of a dB over the entire tuning range, as shown in FIG. 5 (108.4 dBc/Hz at 100 kHz offset from a 4.9 GHz carrier).

In sum, a voltage controlled oscillator is provided comprising an oscillator circuit having an LC tank circuit and first and second transistors connected In a negative resistance configuration across the LC tank circuit. The oscillator circuit generates an oscillator voltage proportional in frequency to an Input control voltage and proportional in amplitude to an input control current. A current source circuit is coupled to the oscillator circuit that supplies the input current to the oscillator circuit. A bias circuit is coupled to the current source circuit that biases the current source circuit. A feedback loop is coupled between the bias circuit and the oscillator circuit, wherein the feedback loop comprises an amplifier having a high input impedance that is coupled to sense the oscillator voltage and output a current proportional to a positive peak of the oscillator voltage to reduce current flowing into the oscillator circuit from the bias circuit by enough to control the level of swing of the oscillator voltage to a desired level.

The above description is intended by way of example only. positive peak of the oscillator voltage to reduce current flowing into the oscillator circuit from the bias circuit by enough to control the level of swing of the oscillator voltage to a desired level.

The above description is intended by way of example only.

What is claimed is:

1. A voltage controlled oscillator comprising:
   a. an oscillator circuit comprising an LC tank circuit and first and second transistors connected in a negative resistance configuration across the LC tank circuit, wherein the oscillator circuit generates an oscillator voltage proportional in frequency to an input control voltage and proportional in amplitude to an input control current;
   b. a current source circuit coupled to the oscillator circuit that supplies the input current to the oscillator circuit;
   c. a bias circuit coupled to the current source circuit that biases the current source circuit; and
   d. a feedback loop coupled between the bias circuit and the oscillator circuit, wherein the feedback loop comprises an amplifier having a high input impedance that is coupled to sense the oscillator voltage and output a current proportional to a positive peak of the oscillator voltage to reduce current flowing into the oscillator circuit from the bias circuit by enough to control the level of swing of the oscillator voltage to a desired level.

2. The voltage controlled oscillator of claim 1, wherein the amplifier comprises first and second transistors each set nominally in cut-off, bases of the first and second transistors being coupled to the oscillator circuit to sense an amplitude of the oscillator voltage.

3. The voltage controlled oscillator of claim 2, and further comprising resistors coupled to the emitters of the first and second transistors, wherein the first and second transistors sense when the amplitude of the oscillator voltage reaches the desired level set by values for the resistors.

4. The voltage controlled oscillator of claim 3, wherein the first and second transistors are responsive to the amplitude of the oscillator voltage reaching the desired level to turn on briefly and draw current away from the bias circuit.

5. The voltage controlled oscillator of claim 4, wherein the bias circuit comprises first and second transistors whose bases are coupled together, a diode having an anode coupled to the base of the first transistor and to the collector of the second transistor, and a current source coupled to the cathode of the diode, wherein a connection is made between the collectors of the first and second transistors of the amplifier and the cathode of the diode in the bias circuit to provide a path to draw current away from the second transistor in the bias circuit.

6. The voltage controlled oscillator of claim 2, wherein the oscillator circuit comprises an LC tank circuit comprised of two inductors coupled to two varactors, and wherein the first and second transistors of the oscillator circuit are PMOS transistors.

7. The voltage controlled oscillator of claim 6, wherein the base of the first transistor of the amplifier is coupled to the gate of the second transistor of the oscillator circuit and the base of the second transistor of the amplifier is coupled to a node between one inductor and one varactor in the LC tank circuit.

8. The voltage controlled oscillator of claim 1, wherein the amplifier is a class C amplifier.

9. A voltage controlled oscillator comprising:
 a. an oscillator circuit comprising an LC tank circuit and first and second PMOS transistors connected in a negative resistance configuration across the LC tank circuit, wherein the LC tank circuit comprises first and second inductors and first and second varactors, wherein the oscillator circuit generates an oscillator voltage proportional in frequency to an input control voltage supplied to a node between the varactors and proportional in amplitude to an input control current supplied to a node between the first and second PMOS transistors;
 b. a current source circuit coupled to the oscillator circuit that supplies the input control current to the oscillator circuit;
 c. a bias circuit coupled to the current source circuit that biases the current source circuit; and
 d. a feedback loop coupled between the bias circuit and the oscillator circuit, wherein the feedback loop comprises an amplifier having a high input impedance that is coupled to sense the oscillator voltage and output a current proportional to a positive peak of the oscillator voltage to reduce current flowing into the oscillator circuit from the bias circuit by enough to control the level of swing of the oscillator voltage to a desired level, wherein the amplifier comprises first and second transistors each set nominally in cut-off, the base of the first transistor coupled to a gate, of the second PMOS transistor in the oscillator circuit and the base of-the second transistor being coupled to a node between one of the inductors and varactors in the LC tank circuit, and resistors connected to the emitters of the first and second transistors such that the value of the resistors control a level at which the first and second transistors turn on and draw current away from the bias circuit.

10. The voltage controlled oscillator of claim 9, wherein the bias circuit comprises first and second transistors whose bases are coupled together, a diode having a cathode coupled to the base of the first transistor and to the collector of the second transistor, and a current source coupled to the anode of the diode, wherein a connection is made between the collectors of the first and second transistors of the amplifier and the anode of the diode in the bias circuit to provide a path to draw current away from the second transistor in the bias circuit.

11. A method for controlling the amplitude of the output voltage of a voltage controlled oscillator, comprising steps of:
 sensing the output voltage of an oscillator circuit with an amplifier having a high input impedance and which outputs a current proportional to a positive peak of the oscillator voltage; and
 drawing current away from a bias circuit that is used to bias a current source circuit that supplies an input current to the oscillator circuit when the amplifier detects that the amplitude of the oscillator voltage reaches a desired value.

* * * * *

UNITED STATES PATENT AND TRADEMARK OFFICE
CERTIFICATE OF CORRECTION

PATENT NO. : 6,700,450 B2
DATED : March 2, 2004
INVENTOR(S) : John W.M. Rogers

It is certified that error appears in the above-identified patent and that said Letters Patent is hereby corrected as shown below:

Title page,
Item [57], ABSTRACT,
Line 4, replace "Is" with -- is --.

Column 1,
Line 17, replace "Integrated" with -- intergrated --.
Line 54, replace "(DCO)" with -- (VCO) --.

Column 2,
Line 17, replace "SGHz" with -- 5GHZ --.
Line 46, add -- , -- after "RB2".
Line 49, replace "." after "400" with -- , --.
Line 49, replace "In" with -- in --.
Line 52, replace "It" with -- it --.

Column 3,
Line 20, replace ")" with -- 1 --.
Line 55, replace "In" with -- in --.
Line 58, replace "Input" with -- input --.

Column 4,
Lines 5-9, remove all text.

Column 5,
Line 30, delete "," after "gate".
Line 31, delete the "-" between "of" and "the".

Signed and Sealed this

Seventh Day of September, 2004

JON W. DUDAS
*Director of the United States Patent and Trademark Office*